US006976202B1

(12) United States Patent
Rezvani et al.

(10) Patent No.: US 6,976,202 B1
(45) Date of Patent: Dec. 13, 2005

(54) METHOD AND APPARATUS FOR TIME-FREQUENCY DOMAIN FORWARD ERROR CORRECTION FOR DIGITAL COMMUNICATION SYSTEMS

(75) Inventors: Behrooz Rezvani, San Ramon, CA (US); George Ginis, Stanford, CA (US)

(73) Assignee: Ikanos Communication Inc., Fremont, CA (US)

(*) Notice: Subject to any disclaimer, the term of this patent is extended or adjusted under 35 U.S.C. 154(b) by 453 days.

(21) Appl. No.: 10/095,618

(22) Filed: Mar. 11, 2002

Related U.S. Application Data

(60) Provisional application No. 60/279,632, filed on Mar. 28, 2001, provisional application No. 60/275,455, filed on Mar. 12, 2001, provisional application No. 60/275,168, filed on Mar. 10, 2001, provisional application No. 60/274,459, filed on Mar. 9, 2001.

(51) Int. Cl.[7] .................. H03M 13/00; H03M 13/03
(52) U.S. Cl. ............................ 714/752; 714/786
(58) Field of Search ................ 714/776, 758, 714/786, 752; 375/222

(56) References Cited

U.S. PATENT DOCUMENTS

| | | | | |
|---|---|---|---|---|
| 5,295,159 | A |   | 3/1994 | Kerpez ........................ 375/38 |
| 5,557,612 | A | * | 9/1996 | Bingham ..................... 370/449 |
| 6,249,543 | B1 | * | 6/2001 | Chow ........................... 375/219 |
| 6,349,138 | B1 |   | 2/2002 | Doshi et al. ................. 380/200 |
| 6,449,288 | B1 | * | 9/2002 | Chari et al. .................. 370/470 |
| 6,570,912 | B1 | * | 5/2003 | Mirfakhraei ................. 375/222 |
| 6,678,318 | B1 | * | 1/2004 | Lai .............................. 375/232 |

OTHER PUBLICATIONS

Telecommunications and mission operations directorate-DSN technology program, Communications Systems and Research Section, JPL; www331.jpl.nasa.gov/public/Turbo-Force.GIF; Publication date unknown but no later than Mar. 7, 2002.

* cited by examiner

Primary Examiner—Shelly Chase
Assistant Examiner—Esaw Abraham
(74) Attorney, Agent, or Firm—IP Creators; Charles C Cary

(57) ABSTRACT

A method and apparatus for time and frequency domain forward error correction (FEC) in a modem which communicates data using multiple discrete sub-channels is provided. The invention may be implemented in hardware, software or firmware. In an embodiment of the invention a modem with a plurality of components forming a transmit path and a receive path is disclosed. The modem communicates data across a wired or wireless communication medium using a multiplicity of discrete sub-channels. The modem includes a transform component and a time domain FEC component. The transform component transforms the multiplicity of discrete sub-channels of a communication between a time domain and a frequency domain on the receive path and vice-versa on the transmit path. The time domain FEC component couples to the transform component. The time domain FEC component has a complementary encoder and decoder portion on the transmit and receive paths respectively. The encoder and decoder portions encode and decode respectively the multiplicity of discrete sub-channels in the time domain.

19 Claims, 10 Drawing Sheets

STATE MACHINE ENCODER

BLOCK ENCODER

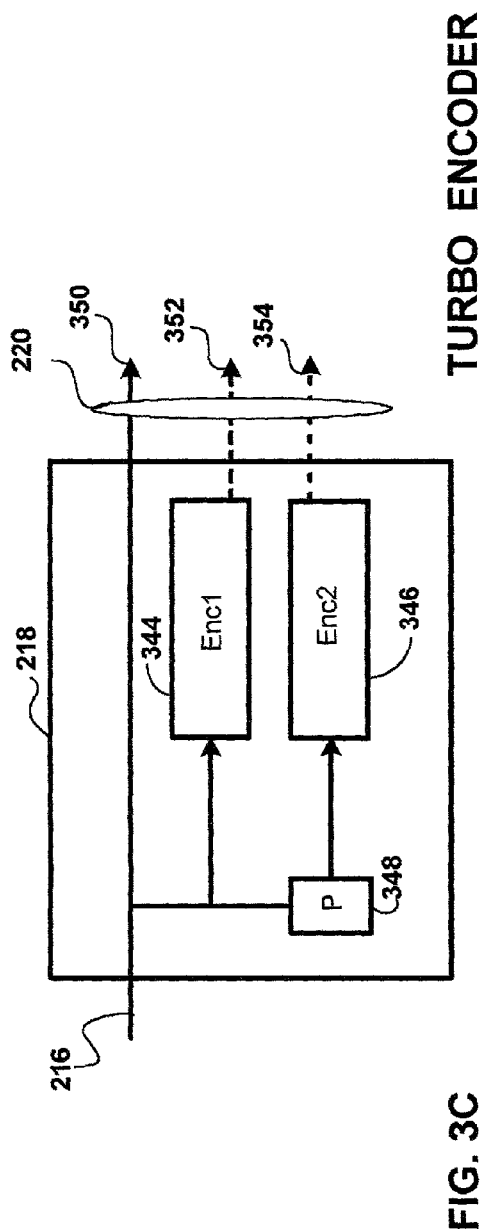
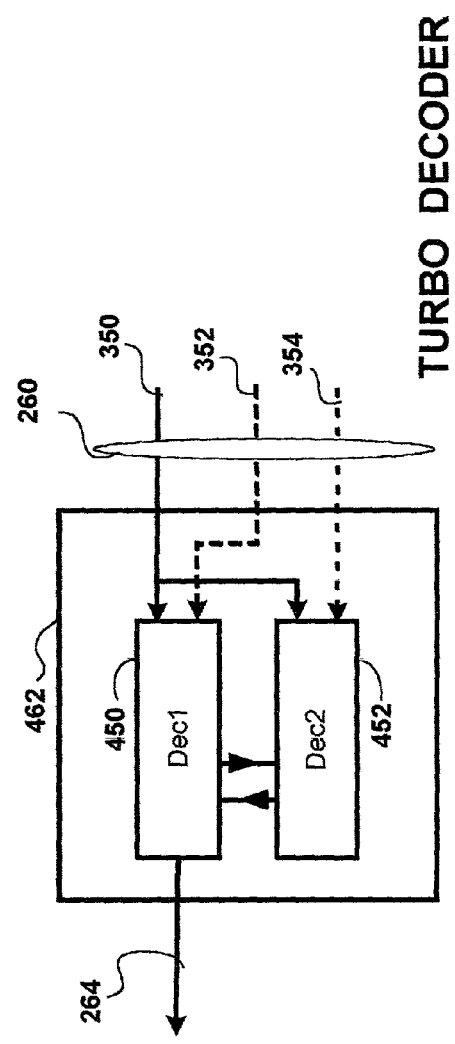
FIG. 3C
TURBO ENCODER
FIG. 3D
TURBO DECODER

ITERATIVE DECODER WITH MESSAGE PASSING

METHOD AND APPARATUS FOR TIME-FREQUENCY DOMAIN FORWARD ERROR CORRECTION FOR DIGITAL COMMUNICATION SYSTEMS

CROSS REFERENCE TO RELATED APPLICATION

This application claims the benefit of prior filed co-pending Provisional Application No. 60/274,459 filed on Mar. 9, 2001 entitled "Method and apparatus for iterative coding concept" Provisional Application No. 60/275,168 filed on Mar. 10, 2001 entitled "Method and apparatus for iterative coding concept" Provisional Application No. 60/275,455 filed on Mar. 12, 2001 entitled "Method and apparatus for iterative coding concept" and Provisional Application No. 60/279,632 filed on Mar. 28, 2001 entitled "Uncertainty principal and joint time-frequency domain channel coding" which are incorporated herein by reference in their entirety as if fully set forth herein.

BACKGROUND OF THE INVENTION

1. Field of Invention

The field of the present invention relates in general to modems and more particularly to forward error correction in digital modems.

2. Description of the Related Art

Digital Subscriber Lines (DSL) technology and improvements thereon including: G.Lite, ADSL, VDSL, HDSL all of which are broadly identified as X-DSL have been developed to increase the effective bandwidth of existing subscriber line connections, without requiring the installation of new fiber optic cable. With X-DSL significant increases in bandwidth have been made possible by utilizing frequencies higher than the voice band to deliver services such as: data, video, audio etc. Thus an X-DSL modem may operate simultaneously with a voice band modem or a telephone conversation. Currently there are over ten X-DSL standards, including: G.Lite, ADSL, VDSL, SDSL, MDSL, RADSL, HDSL, etc. Within each standard there may be more than one line code, or modulation protocol, e.g. discrete multi-tone (DMT) and carrier less AM/PM (CAP). DMT modulation involves establishing a communication channel with a plurality of sub-channels each with a center frequency a.k.a. carrier tone. The sub-channels are frequency division multiplexed across the available bandwidth. Each sub-channel uses quadrature amplitude modulation (QAM) to modulate information.

Orthogonal Frequency Division Multiplexing (OFDM) is another modulation protocol which supports multiple sub-channels. OFDM is typically associated with digital communications over wireless communication mediums. In OFDM available bandwidth is subdivided into a number of discrete sub-channels that are overlapping and orthogonal to each other. Each channel has a corresponding frequency range. Data is transmitted in the form of symbols with a predefined duration. The data can be encoded in amplitude and/or phase, using encoding methods such as Binary Phase Shift Key (BPSK), Quadrature Phase Shift Key (QPSK), m-point Quadrature Amplitude Modulation (m-QAM).

Any digital communication experiences signal interference, and communication protocols which support multiple sub-channels such as DMT and OFDM are no exception. Interference can effect both the amplitude and the phase of the sub-channels. Such noise can arise across the time and/or frequency domains. At the receiver the data has to be separated from the noise. One popular technique for achieving the separation of data from the noise in a received signal is known as forward error correction (FEC). FEC introduces additional redundant bits into communications between modems and additional processing overhead to handle the transmission and reception of a stream of digital information. The redundant bits are added at the transmitter by application of any of a number of FEC algorithms in a process known as encoding the data. At the receiver the same algorithm is performed to detect and remove errors in the transmitted data in a process known as decoding the signal. The primary benefit of FEC is that re-transmission is not required.

With each improvement in bandwidth of multiple sub-channel communication systems there is a corresponding increase in noise, with the potential to reduce signal integrity to unacceptable levels. What is needed is a method and apparatus for increasing signal integrity in digital communication systems which support multiple sub-channels.

SUMMARY OF THE INVENTION

A method and apparatus for time and frequency domain forward error correction (FEC) in a modem which communicates data using multiple discrete sub-channels is provided. The apparatus may be used with wired or wireless communication mediums with either optical or electrical signal modulation. The invention may be applied with particular advantage in broadband digital communication systems in which sub-channel response and/or noise spectrum are frequency dependent. The invention may be applied with particular advantage in multi-channel communication protocols in which information symbols are expressed during transmission and reception in both the frequency domain as well as the time domain. Examples of such protocols include: discrete multi-tone (DMT) and frequency division multiplexed (FDM), and orthogonal frequency division multiplexed (OFDM) communication protocols. In these communications protocols information symbols are expressed in both the frequency and time domains thus reducing the overhead associated with FEC in the dual domains, i.e. time domain and frequency domain. The invention may be implemented in hardware, software or firmware.

In an embodiment of the invention a modem with a plurality of components forming a transmit path and a receive path is disclosed. The modem communicates data across a communication medium using a multiplicity of discrete sub-channels. The modem includes a transform component and a time domain FEC component. The transform component transforms the multiplicity of discrete sub-channels of a communication between a time domain and a frequency domain on the receive path and vice-versa on the transmit path. The time domain FEC component couples to the transform component. The time domain FEC component has a complementary encoder and decoder portion on the transmit and receive paths respectively. The encoder and decoder portions encode and decode respectively the multiplicity of discrete sub-channels in the time domain.

BRIEF DESCRIPTION OF THE DRAWINGS

These and other features and advantages of the present invention will become more apparent to those skilled in the art from the following detailed description in conjunction with the appended drawings in which:

FIGS. 3C–D show encoder and decoder portions of an FEC implementing a turbo encoder which is a specific subtype of the encoder shown in FIG. 3A.

DETAILED DESCRIPTION OF THE EMBODIMENTS

A method and apparatus for time and frequency domain forward error correction (FEC) in a modem which communicates data using multiple discrete sub-channels is provided. FEC is a technique used between a transmitting modem and a receiving modem to improve signal integrity without re-transmission of data corrupted or lost in the communication medium which couples the transmitting and receiving modem. To implement FEC the transmitting modem encodes data in a manner which allows the receiving modem when decoding the data to both identify and correct errors incurred in transmission over a communication channel. FEC typically involves a slight penalty in terms of redundant bits in the transmitted data. The current invention sets forth method and apparatus for FEC in multi-domain communication systems in which both transmitted and received data is expressed in both the time as well as the frequency domains. The current invention may be implemented in modems communicating across diverse communication mediums including: wired, wireless or optical communication mediums. The current invention may be implemented in modems supporting a range of communication protocols including: discrete multi-tone (DMT), frequency division multiplexing (FDM), and orthogonal frequency division multiplexing (OFDM) communication protocols. DMT is one of the accepted modulation protocols for digital subscriber line (DSL) technology and improvements thereon including: G.Lite, ADSL, VDSL, SDSL, MDSL, RADSL, HDSL, etc. all of which are broadly identified as X-DSL. The following FIG. 1 shows one embodiment of a digital communication system implementing the method and apparatus of the current invention over a subscriber line communication medium.

Figure 1:
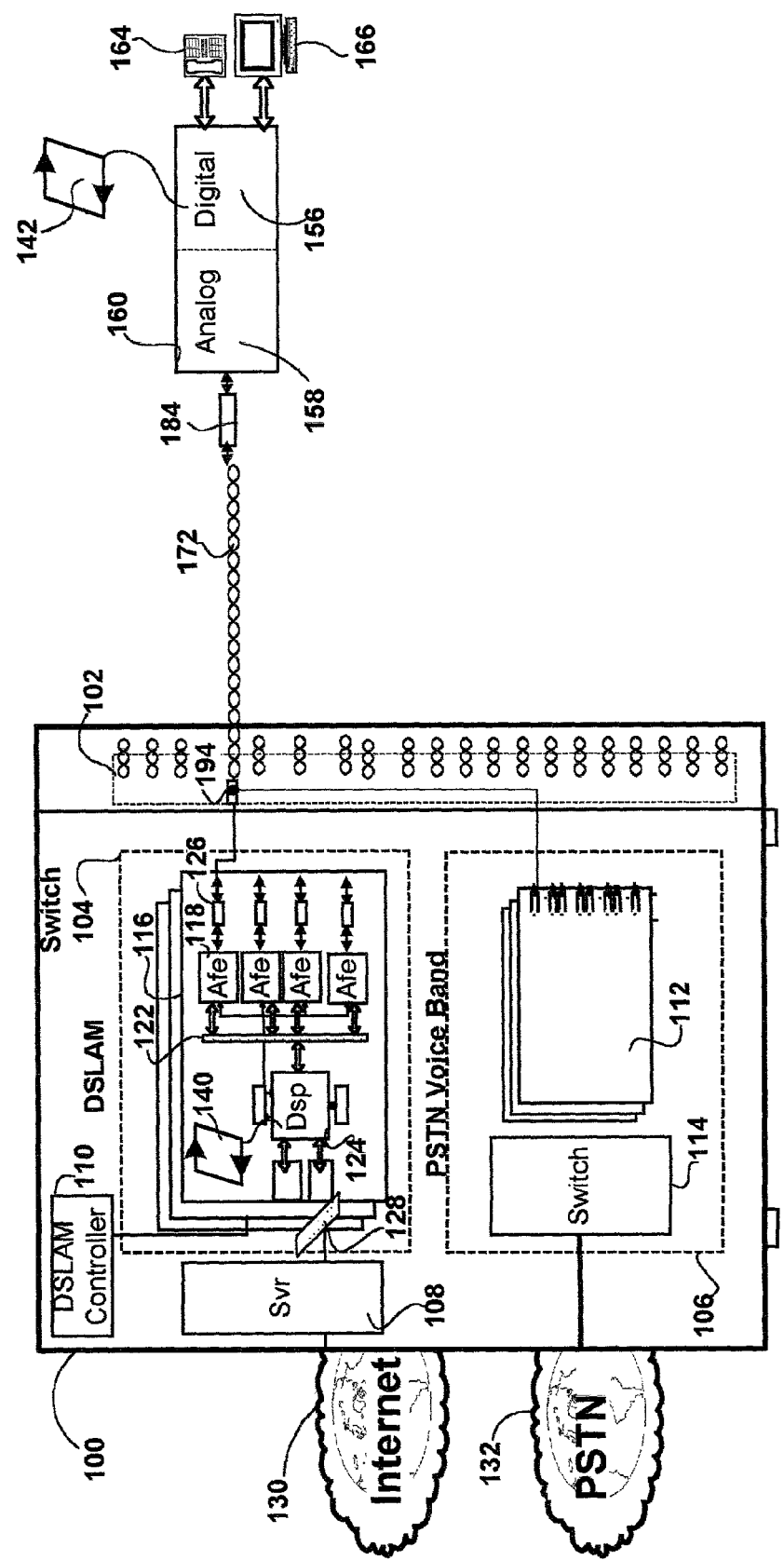
FIG. 1 shows an embodiment of the current invention implemented within a digital communication system with a logical modem at a central office (CO) coupled over a subscriber line to a physical modem at a customer's premises.

FIG. 1 shows an embodiment of the current invention implemented within a digital communication system with a logical modem at a central office (CO) coupled over a subscriber line communication medium to a physical modem at a customer's premises. The system includes the CO 100 coupled across a subscriber line 172 with a physical modem 160 positioned at a customer's premises. All subscriber lines handled by the CO originate in the frame room 102 of the CO. From this room connections are made for each subscriber line via splitters and hybrids to both a digital subscriber line access module (DSLAM) 104 and to the voice band racks 106. The splitter 194 shunts voice band communications to dedicated line cards, e.g. line card 112 or to a voice band modem pool (not shown). The splitter shunts higher frequency X-DSL communications on the subscriber line to a selected line card, e.g. line card 116, within the DSLAM. Voice band call set up is controlled by a Telco switch matrix 114 such as SS7. This switch matrix makes point-to-point connections to other subscribers for voice band communications across the public switched telephone network 132. The X-DSL communications may be processed by a universal line card such as line card 116. That line card implements a plurality of logical modems via a digital signal processor (DSP) 124 coupled across a packet bus 122 with a number of analog front ends (AFE) of which AFE 118 is referenced. The DSP implements dual domain FEC processes 140 which will be described and discussed in the following figures and accompanying descriptions. Each AFE couples via a hybrid front end (HFE) with a corresponding one of the subscriber lines. AFE 118 couples via HFE 126 with subscriber line 172. For downstream communications from the CO to the remote site, the DSP modulates the data for each communication channel, the AFE transforms the digital symbol packets assembled by the DSP and converts them to an analog signal which is output on the subscriber line associated with the respective channel. For upstream communications from the remote site to the CO the AFE converts the communications to digitized data samples which are sent to the DSP where they are demodulated. The DSP may be capable of multi-protocol support for all subscriber lines to which the AFE's are coupled. Communication between AFE(s) and DSP(s) may be packet based. The line card 116 is coupled to a back-plane bus 128 which may be capable of offloading and transporting X-DSL traffic between other DSPs for load balancing. The back-plane bus of the DSLAM also couples each line card to the Internet 130 via server 108. Each of the DSLAM line cards operates under the control of a DSLAM controller 110 which handles global provisioning, e.g. allocation of subscriber lines to AFE and DSP resources. The various components on the line card form a plurality of logical modems each handling upstream and downstream communications across corresponding subscriber lines. When an X-DSL communication is established on a subscriber line, a specific channel identifier is allocated to that communication. That identifier may be used in the above mentioned packet based embodiment to track each packet as it moves in an upstream or downstream direction between the AFE and DSP.

At the customer premises a physical modem 160 is shown coupled via HFE 184 to subscriber line 172. That physical modem has an analog portion 158 and a digital portion 156. The physical modem couples voice band communications with the phone 164 and X-DSL band communications with the computer terminal 166. The digital portion 156 of the physical modem implements dual domain FEC processes 140 which will be described and discussed in the following figures and accompanying descriptions.

In alternate embodiments of the invention the modem and associated methods claimed herein may be implemented in discrete devices such as repeaters, cell phones or computers. Within those devices the modem may be implemented in hardware, software or firmware on a digital signal processor (DSP), an application specific integrated circuit (ASIC), a field programmable gate array (FPGA) or processor running the corresponding processes set forth in the following drawings and accompanying text.

Figure 2:
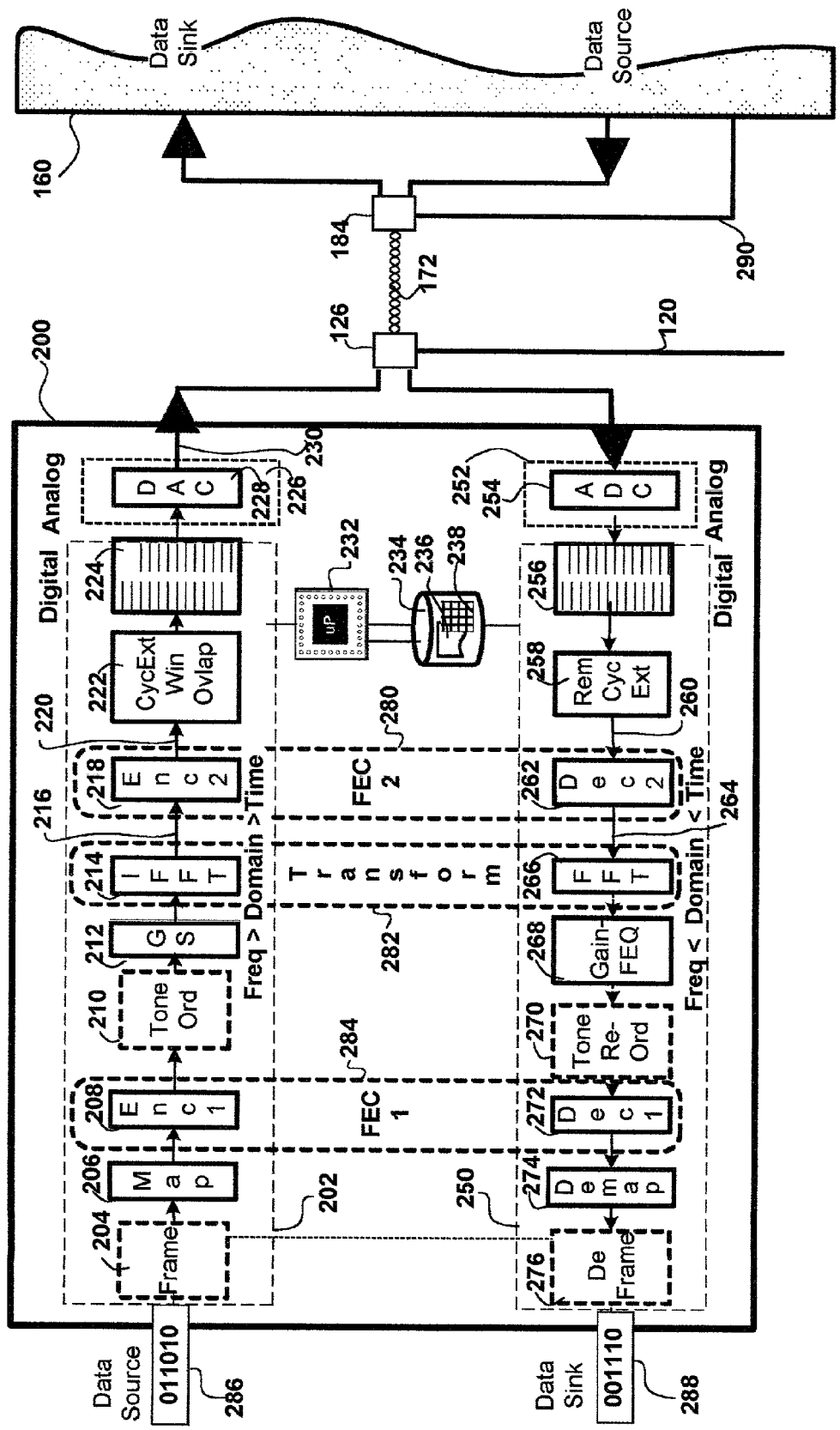
FIG. 2 is a detailed hardware block diagram showing the transmit and receive path components of a modem including forward error correction (FEC) in accordance with an embodiment of the current invention.

FIG. 2 is a detailed hardware block diagram showing the transmit path 202,226 and receive path 252, 250 components of a modem 200 including forward error correction (FEC). The ordering and type of components are consistent with a logical or physical modem configured to implement a DMT communication protocol. The modem components are a logical expression of processes which may be implemented in alternate embodiments of the invention in hardware, software or firmware on a chip or as software processes. In the example shown the modem components may be implemented by the DSP and AFE on the line care 116 shown in FIG. 1.

The transmit and receive paths of the modem are coupled via hybrid front end (HFE) 126 and subscriber line 172 with the HFE 184 of the physical modem 160 shown in FIG. 1. The transmit path includes digital portion 202 and analog portion 226 for modulation of data. The signal lines 120 and 290 are shown coupled to the HFEs 126 and 184 respectively which in this embodiment of the invention contains appropriate filters, or splitter to divert voice band traffic.

The transmit path includes digital and analog portions 202 and 226 respectively for modulation of data. During showtime the transmit path accepts a digital stream from a data source 286 as input and passes that stream through successive components of the transmit path for modulating the downstream data onto the subscriber line 172. In the framer 204 the data is parsed into predefined packets of bits, with the number of bits determined by the bandwidth of the communication medium established during modem initialization. In the mapper 206 the bits are converted to symbols with each symbol composed of sub-symbols. Each sub-symbol is a complex number describing in the frequency domain the desired phase and/or amplitude relationship required to modulate the corresponding bits onto a corresponding one of the carrier tones with which the communication medium will be modulated. The modulated tones of a tone set form the individual sub-channels of the communication channel established by the modem over the communication medium. Since the carrier tones are frequency division multiplexed (FDM) with one another across the allocated bandwidth, each sub-symbol is said to express in the frequency domain the required modulation of the communication medium. Next the encoder portion 208 of the frequency domain FEC 284 encodes the sub-symbols generated by the mapper. The encoding process introduces redundant bits into the information stream. These redundant bits will be used by a corresponding decoder portion of a frequency domain FEC on a receiving modem to identify and correct errors in the information transmitted. In the tone orderer 210 the bits are allocated across the tone bins associated with each of the DMT sub-channels. The specific number of bits per tone is established during the initialization of the modem. Then after gain scaling in the gain scaler 212 all of the sub-symbols are converted from the frequency domain to the time domain. This is accomplished in the inverse Fourier transform (IFFT) portion 214 of the transform component 282.

Next, in the encoder portion 218 of the time-domain FEC 280 the sub-symbols output by the IFFT are encoded again. This time the encoding is performed in the time domain which introduces further redundancy in the information stream. These redundant bits will be used by a corresponding decoder portion of a time domain FEC on a receiving modem to identify and correct errors in the information transmitted. The use of both time and frequency domain encoders on the transmit path along with corresponding time and frequency domain encoders on the receiving modem offers increased diversity which can be exploited to improve the reliability of the modem; to increase immunity to noise, e.g. cross-talk and impulse; and to reduce codeword length for the encoder/decoder and therefore the complexity of the FEC components.

Next in module 222 the cyclic extension, windowing and window overlap is applied to the digitized sub-symbols output by the IFFT. The delay advance buffer 224 couples the digital components 202 with the Digital to analog converter (DAC) 228 which is part of the analog portion 226 of the modem's transmit path. The analog portion may also include an interpolator and digital or analog filters, in alternate embodiments of the invention.

The receive path includes analog and digital portions 252 and 250 respectively for demodulation of data. During showtime the receive path accepts modulated upstream data from subscriber line 172 and digitizes the received data in the analog-to-digital converter (ADC) 254 which is part of the analog portion of the receive path. The analog portion may also include digital or analog filters and a decimator, in alternate embodiments of the invention. The digitized data is passed via delay advance buffer 256 to the cyclic prefix removal module 258, where any cyclic prefix is removed from the digitized data associated with each incoming symbol. Next, in the decoder portion 262 of the time-domain FEC 280 the sub-symbols in the time domain are decoded.

Next in the fast Fourier transform (FFT) portion 266 of the transform component 282, each sub-symbol in the time domain is converted to a corresponding sub-symbol in the frequency domain. Next the appropriate gain scaling and frequency equalization (FEQ) is performed in the gain FEQ component 268. Next the sub-symbols associated with each tone are re-ordered in the tone re-ordered 270. Then decoding of the sub-symbols in the frequency domain is performed in the decoder portion 272 of the frequency-domain FEC 284. Subsequently, each de-coded sub-symbol is then converted in the de-mapper 274 to corresponding bits. These bits are de-framed in the de-framer 276. The resultant bit stream is output to the data sink 288.

The core processor 232 is shown coupled to the transmit and receive path components as well as to the memory 234. The core-processor in an embodiment of the invention provides overall control for the modem. Memory 234 stores setup data 236 for the specific DMT or other protocol(s) which the modem supports as well as initialization data 238, e.g. gain tables, equalization parameters, power spectral density (PSD) parameters etc. determined during the initialization of a pair of modems across a given communication medium, e.g. subscriber line 172.

The arrangement and type of components shown above are consistent with an embodiment of the invention in which the modem supports DMT modulation. In an alternate embodiment of the invention in which the modem supports OFDM modulation selected components may not be required. These include gain scaler 212, and in some cases the tone orderer 210, tone re-orderer 270, cyclic extension adder 222 and cyclic extension remover 258. In an OFDM embodiment of the invention the time and frequency domain FEC components 280, 284 and the transform component 282 would be present. In an alternate embodiment of the invention the transform component would perform domain transformation between time and frequency domains utilizing methods other than a Fourier transform, e.g. bandpass filtering without departing from the scope of the claimed invention.

Figure 3A:
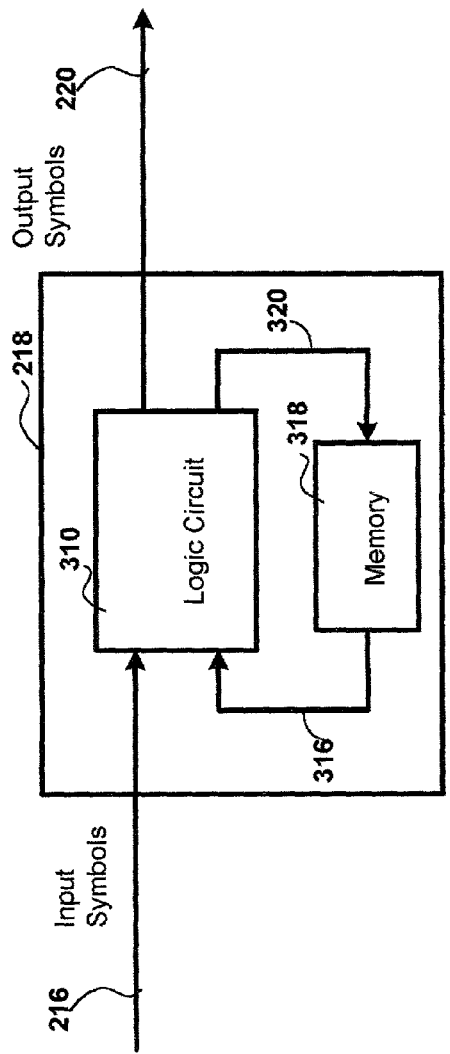
FIGS. 3A–B are detailed hardware block diagrams of alternate embodiments of encoder portions of the FEC shown in FIG. 2.
Figure 3B:
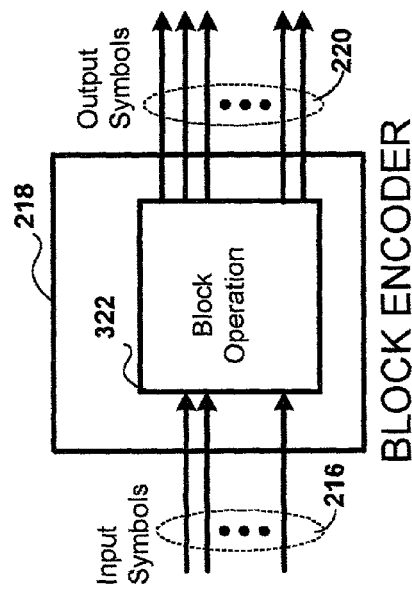

FIGS. 3A–C are detailed hardware block diagrams of alternate embodiments of encoder portions of the FEC shown in FIG. 2. The decoder portion of each FEC complements the selected encoder both in terms of coder type, e.g. block, state machine or turbo, and code parameters. These may be implemented in the encoder portions 218, 208 of the frequency and or time-domain FEC components 280, 284 respectively, with corresponding de-coder portions (not shown). In the embodiment shown in FIG. 3A encoder portion 218 implements state machine encoding with a logic circuit 310 which accepts an input stream 216 (See FIG. 2) of sub-symbols and provides an output stream 220 (See FIG. 2) of encoded sub-symbols with redundant bits therein. The memory 318 is coupled to the logic circuit by signal lines 316 and 320, with the former delivering current state information to the logic circuit from the memory, and the latter delivering next state information from the logic circuit to the memory. Examples of state machine encoder/decoder types suitable for use with the current invention include: trellis and convolutional. FIG. 3B shows a block type encoder 322 implemented within the encoder portion of the frequency domain FEC 280 (See FIG. 2). Redundant bits are added to the input stream 216 (See FIG. 2) and delivered as output on line 220 (See FIG. 2). Examples of block type encoders include: cyclic codes such as checksum or Reed Solomon code with the latter a subset of Bose-Chaudhuri-Hocquenghem (BCH) cyclic codes. These provide multiple-error correction.

FIGS. 3C–D show encoder and decoder portions of an FEC implementing a turbo encoder which is a specific sub-type of the state machine encoder shown in FIG. 3A. The input 216 is a block of K symbol bits for which the two encoders 344, 346 generate parity symbols. Each encoder implements a recursive convolutional code. The interleaver 348 which interleaves the input stream to one of the encoders thus providing diversity which improves the performance of the combined encoders. The original 350 and encoded data streams 352, 354 are output on signal line 220 (See FIG. 2) for modulation onto the communication medium. At the receiving modem the turbo decoder portion of the FEC accepts input on signal line 260 of the original and encoded data streams and delivers them to decoders 450–452. The turbo decoder iterates between the outputs of the decoders 450–452 until a satisfactory convergence on a codeword is reached at which point the decoded output stream is provided on signal line 264 (See FIG. 2).

Figure 4A:
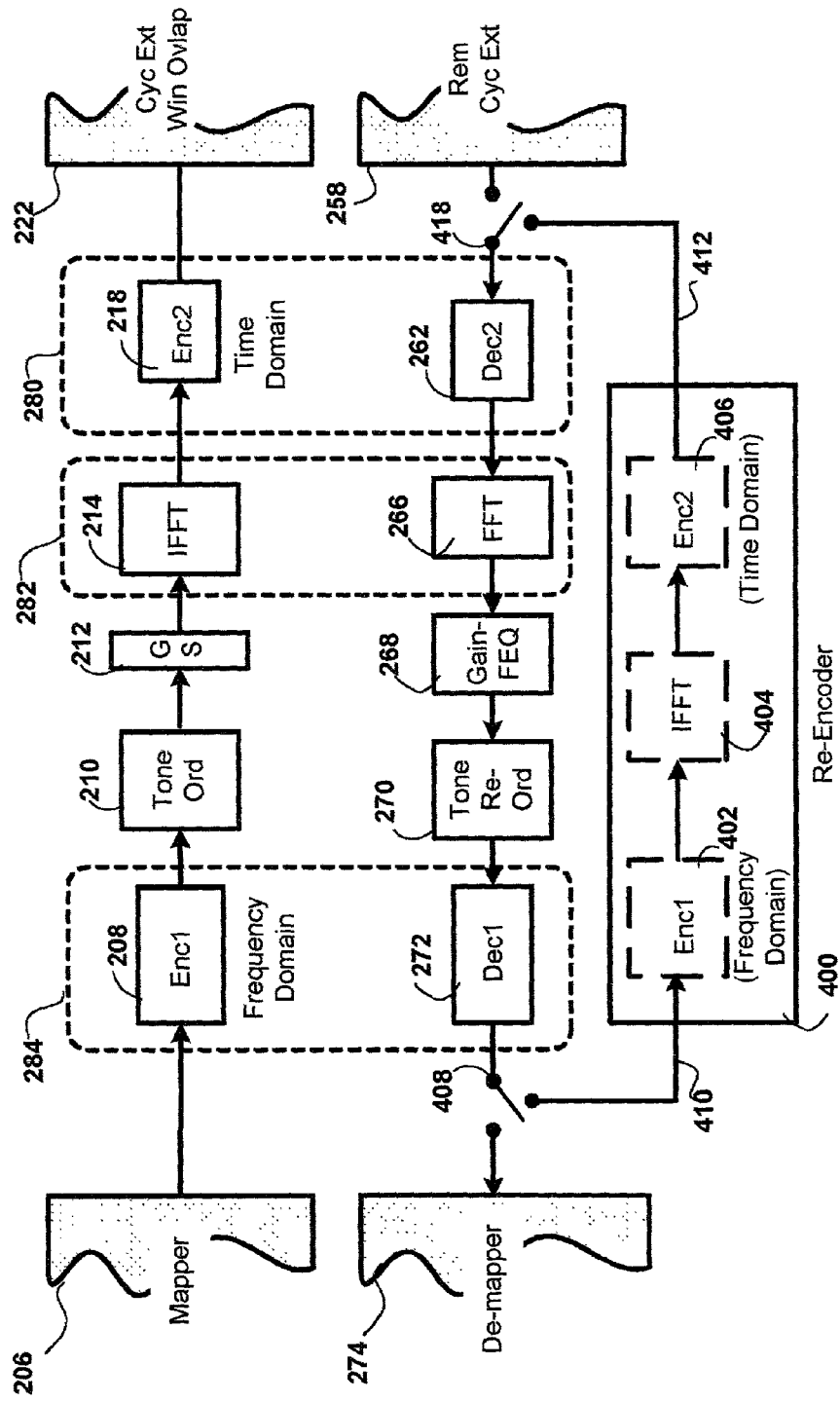
FIG. 4A is a detailed hardware block diagram of the FEC portions of the transmit and receive path components shown in FIG. 2 in an embodiment of the invention in which iterative decoding is implemented.

FIG. 4A is a detailed hardware block diagram of the FEC portions of the transmit and receive path components shown in FIG. 2 in an embodiment of the invention in which iterative decoding is implemented. In this embodiment of the invention iteration of time and frequency domain decoding on the receive path of the modem is provided. by switches 408, 418 and re-encoder 400 which can be configured to form a loop successively decoding a received set of information until a high confidence in the reliability of the decoded information is obtained, at which point the next set of information is processed through multiple rounds of decoding and encoding. Switch 418 couples the input of the decoder portion 262 of the time-domain FEC 280 to the received information stream at the output of the cyclic prefix removal component 258 (See FIG. 2) to obtain the next set of information for iterative decoding. During iterative coding switch 408 at the output of the decoder portion 272 of the frequency domain FEC 284 couples to the input 410 or the re-encoder 400. Switch 418 couples the output 412 of the re-encoder to the 400 to the input of the decoder portion 262 of the time-domain FEC component 280. The re-encoder contains a frequency domain encoder 402 an IFFT 404 for converting from the frequency to the time domain, and a time-domain encoder 406. Successive rounds of decoding and re-encoding are performed until an acceptable output is obtained at which point the decoded information is passed via switch 408 to the de-mapper 274 and the next received set of information is introduced into the time and frequency domain decoder portions for iterative decoding. In an embodiment of the invention iterative decoding is selectively introduced by the processor 232 (See FIG. 2) when the reliability of the decoded symbols drops below a required threshold reliability. In an alternate embodiment of the invention iterative decoding is a fixed feature of the receiver.

Figure 4B:
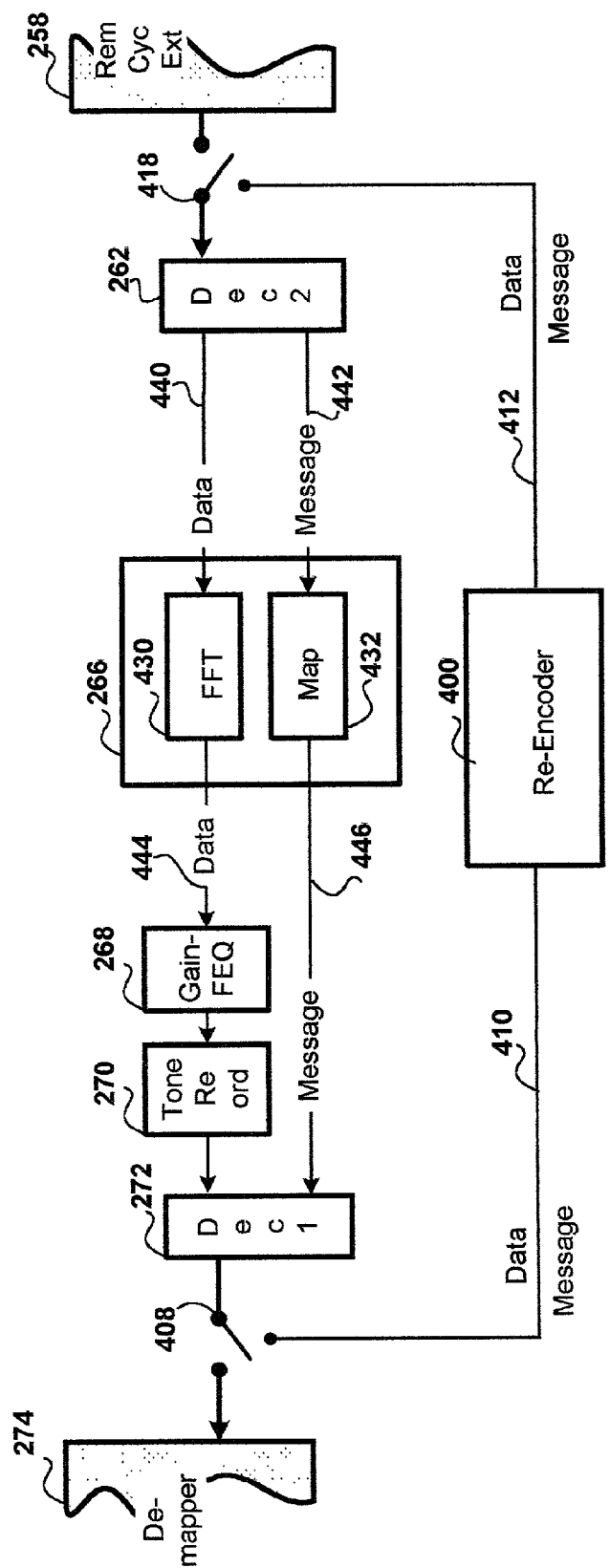
FIG. 4B is a detailed hardware block diagram of an alternate embodiment of the invention to that shown in FIG. 4A in which iterative decoding with message passing is implemented.

FIG. 4B is a detailed hardware block diagram of an embodiment of the invention with iterative decoding and message passing. These messages are typically "soft" information about the reliability of the output of each decoder. Soft information refers to any measure of reliability of the decoded bit. The time domain to frequency domain transform is performed by an FFT module 430 and a message mapper 432 which are shown as part of the FFT portion 266 of the transform component 282 (See FIG. 2). The decoder 262 provides a data output stream 440 to the FFT module 430 and a message output stream 442 to the input of the message mapper 432. Each message expresses a confidence or reliability factor for an associated block of data. The FFT module converts the data from the time to the frequency domain and provides the data on signal line 444 to the gain/FEQ component 268 and tone re-orderer 270 which delivers the data to the decoder. The decoder 272 decodes the data using reliability factors received from the message mapper. The message mapper converts the reliability information in the messages from decoder 262 from the time to the frequency domain and provides them to the decoder 272 on signal line 446. During iterative decoding the data and message outputs from the decoder 272 are switchably coupled by switch 408 to the re-encoder 400. The re-encoder uses the message from decoder 272 during re-encoding of the data. The re-encoder provides a re-encoded data and message to the input of decoder 262 via switch 418 for the next round of encoding.

By way of example, assuming that the message passing decoder 262 has the capability to estimate the probability of a received bit being a binaryl. This probability may serve as "soft information" to the later decoding stage(s). For instance, a value of 0.51 implies that a decision on the bit cannot be made with confidence. A value of 0.99 implies that the bit is almost surely equal to 1, and this knowledge may be useful in attempting to recover more bits in the frequency domain decoder 272. Once a set of received time domain data enters decoder 262, a decoding process begins which consists of a number of iterations. When the decoding performed in decoder 262 concludes, a set of decoded symbols in the frequency domain is produced. These are converted from the time to the frequency domain and presented to decoder 272 along with soft information from the message mapper 432 about the symbols. The decoder uses the soft information from the time domain decoder to increase the reliability of the decoded data it generates.

The following is an example of an embodiment of the iterative decoder simplified for purposes of clarity to handle a multi-tone modulation with only two carrier tones and with frequency domain symbols which have values of −1 to 1. Thus, each received block contains only 2 symbols. It is assumed that encoder portion 208 of the frequency domain FEC implements a simple repetition code. Thus the input of encoder 208 is a single symbol, and its outputs are two symbols identical to the input symbol. These output symbols are then converted from the frequency domain to the time domain in the IFFT 214 with possible values of the output symbols of: −1, 0 and 1. The output symbols are sent to encoder 218 which in this example does not introduce any further redundancy. The receiver converts the signal to symbols which are provided as input in blocks of two to the decoder 262. Decoder 262 is a "soft-input soft-output" decoder. The "soft input" is previous (a priori) knowledge about the probability of a symbol having a specific value. During the first iteration, there is no such a priori knowledge, thus the probabilities for all values are assumed equal. The "soft output" is information provided to the next stages about the reliability of the decoder decision. Decoder 262 makes a decision using as a basis both the received samples and a priori information.

In the example, let y be a received sample, $p(x_0)$ be the a priori probability of the transmitted symbol being equal to $x_0$, and $S_2$ be the noise variance. A possible decision rule can be defined as follows: If the relationship set forth in the following Equation 1 holds true for all possible values x different than $x_0$, then declare that the transmitted symbol is $x_0$. This rule is known as the Maximum-A-posteriori-Probability rule.

Equation 1:

$$p(x_0)e^{\left[-\frac{(y-x_0)^2}{2s_2}\right]} > p(x)e^{\left[-\frac{(y-x)^2}{2s_2}\right]}$$

The soft output, i.e. reliability measure, may then be defined as in the following Equation 2:

Equation 2:

$$\text{Output} \cong e^{\left[-\frac{(y-x_0)^2}{2s_2}\right]}$$

This information indicates how reliable the decision is. If its value is small, then the reliability is small, e.g. noise is large, otherwise the reliability is large, e.g. noise is negligibly small.

Now, let $X_1$ and $X_2$ be the outputs of decoder 262, and $Y_1$, $Y_2$ their Fourier transform where $Y_1 = X_1 + X_2$ and $Y_2 = X_1 - X_2$. The possible values of $Y_1$ and $Y_2$ are now −2, −1, 0, 1 and 2. Let $s\_X_1$ and $s\_X_2$ be the reliability measure of $X_1$ and $X_2$, and similarly $s\_Y_1$ and $s\_Y_2$ the reliability measure of $Y_1$ and $Y_2$. An example expression relating the two is shown in the following Equation 3:

IF ($Y_1$ is −2, 0, or 2) $\{s\_Y_1 = \log(s\_X_1) + \log(s\_X_2)\}$

ELSE $\{½((\log(s\_X_1) + \log(s\_X_2))\}$

IF ($Y_2$ is −2, 0, or 2) $\{s\_Y_1 = \log(s\_X_1) + \log(s\_X_2)\}$

ELSE$\{½((\log(s\_X_1) + \log(s\_X_2))\}$ Equation 3:

Equation 3 "penalizes" the illegitimate values −2, 0 and 2, and "rewards" the values −1 and +1. This transformation is performed in the mapper 432. Then, $Y_1$, $Y_2$ as well as $s\_Y_1$ and $s\_Y_2$ serve as inputs to decoder 272. Since code "1" is just a repetition code, a simple decision strategy is shown in the following Equation 4:

```
IF (Y₁>0 and Y₂>0) {Declare+1}
ELSE IF (Y₁<0 and Y₂<0) {Declare−1}
ELSE IF (Y₁<0 and Y₂>0)
    {
        IF(s_Y₁ > s_Y₂){Declare tentative decision−1
                        Reliability of tentative decision = s_Y₂}
        ELSE    {Declare tentative decision+1
                 Reliability of tentative decision = s_Y₁}
    }
ELSE IF(Y₁>0 and Y₂<0)
    {
        IF(s_Y₁ > s_Y₂){Declare tentative decision+1}
                        Reliability of tentative decision = s_Y2
        ELSE    {Declare tentative decision−1
                 Reliability of tentative decision = s_Y1}
    }
```

Tentative decision-making allows further decoding iterations to be performed. In that case, the reliability of the tentative decision is fed back to from decoder 272 via re-encoder 400 to the decoder 262. The mapping operation in this case, is set forth in the following Equation 5:

Equation 5:

If $(x_0 = -1 \text{ or } 1)$ $\{p(X_1 = x0) = c_1 e^{(Rel)}\}$

ELSE $\{p(X_1 = x0) = 1 - 2c_1 e^{(Rel)}\}$

IF $(x_0 = 0)$ $\{p(X_2 = x0) = 2c_2 e^{(Rel)}\}$

ELSE $\{p(X_2 = x0) = 1 - c_2 e^{(Rel)}\}$ where c1, c2 are appropriately chosen constants and "Rel" is the reliability of the tentative decision. The probabilities computed above serve as a reliability message, a.k.a soft inputs or a priori probabilities to decoder 262. The decoding cycle terminates when either a certain number of iterations is exceeded, or when the decision's reliability exceeds a certain threshold.

A side effect of iterative decoding is that the decoding latency is increased. Since each decoder is associated with a certain delay in order to produce the decoded output, the multiple decoding rounds increase decoding latency. Thus the iterative decoder requires clock speeds for the decoders and encoders which are integer multiples of the symbol rate, or parallelism in the iterative decoding architecture.

Figure 5:
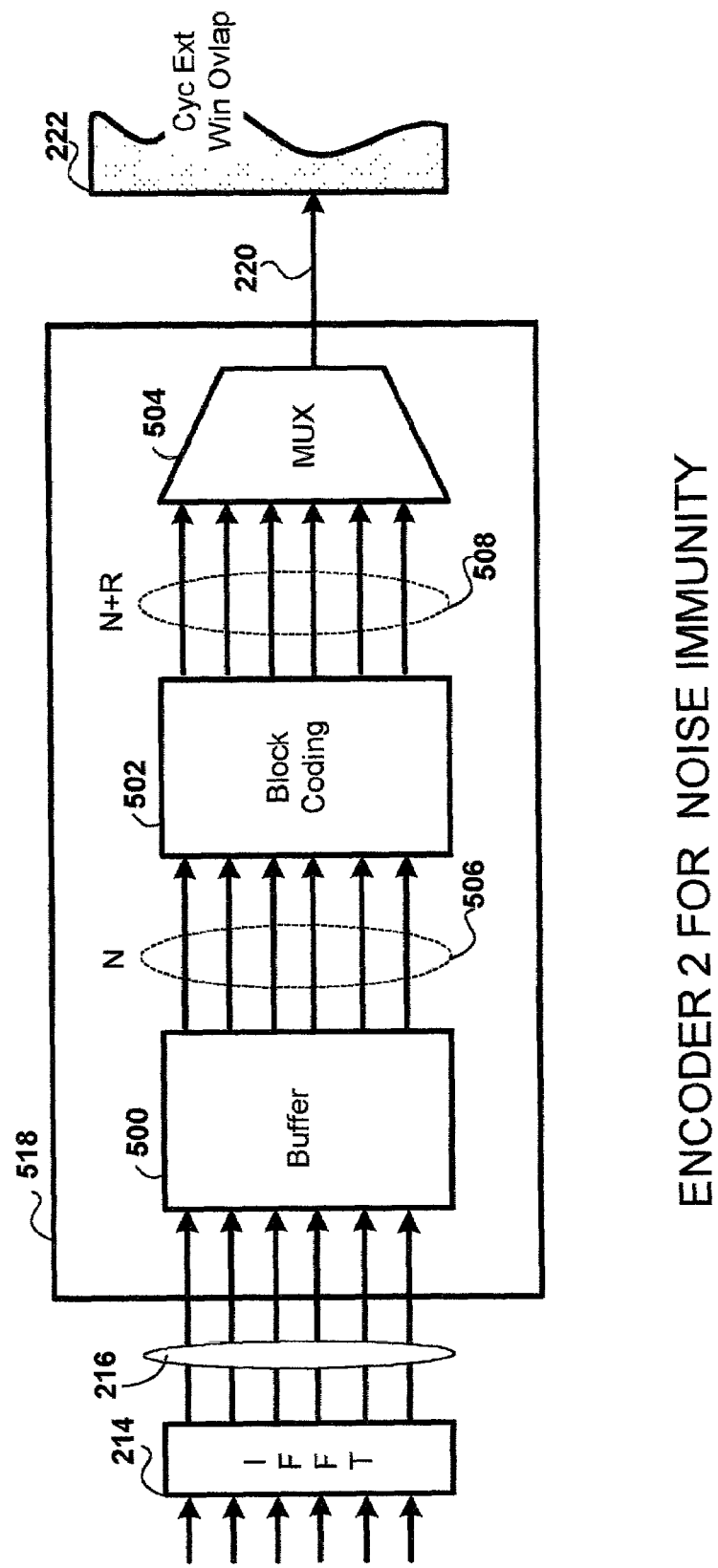
FIG. 5 is a detailed hardware block diagram showing an embodiment of the invention with an encoder portion of the FEC component for increasing the noise immunity of the modem
Figure 6A:
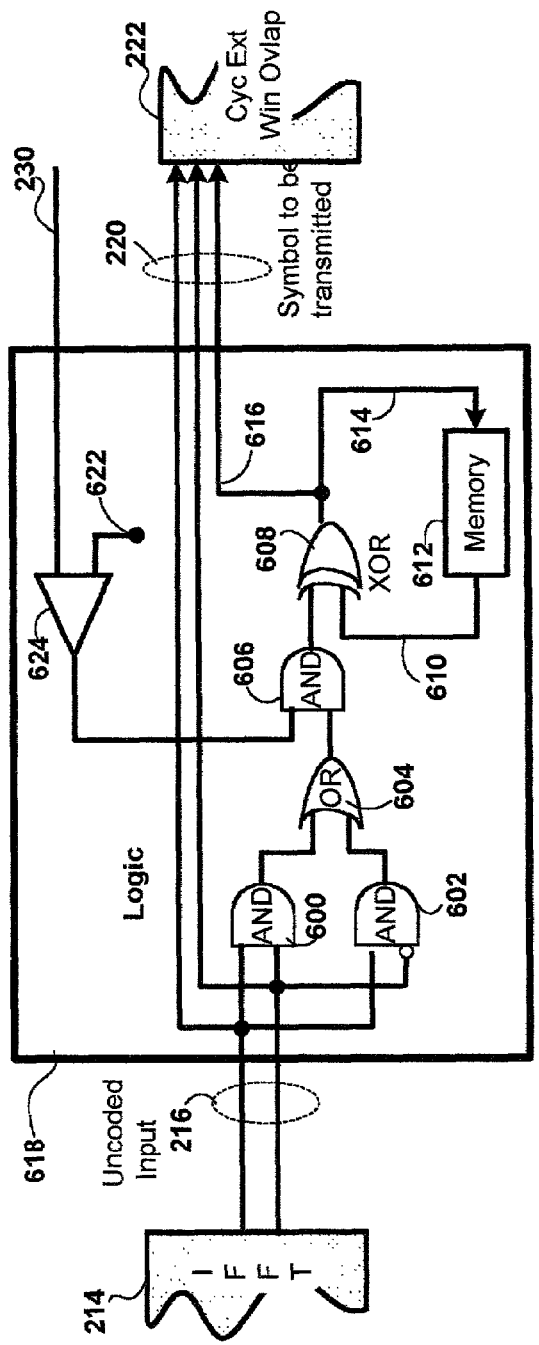
FIGS. 6A–B show encoder and decoder portions of an embodiment of the FEC which reduces Peak to Average Ratios (PAR) for the modem
Figure 6B:
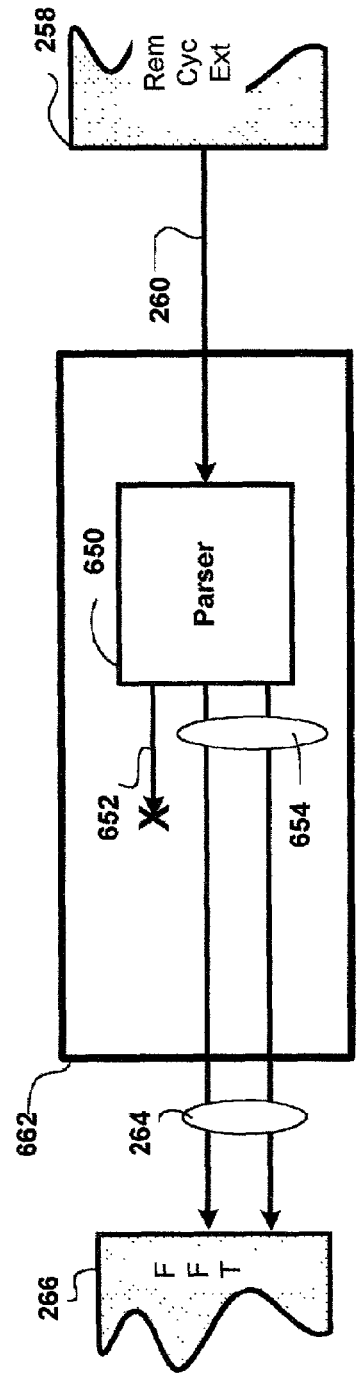

FIG. 5 is a detailed hardware block diagram showing an embodiment of the invention with an encoder portion 518 of the frequency domain FEC component 280 (See FIG. 2) on the transmit path that is used to increase the noise immunity of the modem. In a modem implementing modulation across a multiplicity of sub-channels, the noise spectrum and/or sub-channel response are frequency dependent. Noise immunity can be increased by encoding in the frequency domain with a block type encoder implementing a simple checksum or a Reed Solomon (RS) block code. Encoder 518 includes a buffer 500, a block coder 502 and a multiplexer 504. The block coder accepts sub-symbols associated with successive symbols in the frequency domain from the IFFT 214 on input lines 216 (See FIG. 2). Symbols are buffered until the buffer contains a number of symbols equal in length 'N' to that required for input 506 to the block coder 502. One or more than one symbol may be buffered depending on the length of the block code. The block coder 502 encodes the N symbols of an uncoded block from the buffer. An additional R symbols are added. The N+R coded symbols are input to the multiplexer 504 and output as a multiplexed stream 220 of block coded symbols which are input to the next component in the transmit path which in the embodiment shown in FIG. 2 is the cyclic extension and window overlap component 222. The frequency domain decoder on the receive path of the receiving modem then implements a complementary RS block de-code to decode and passes the resultant decoded sub-symbols to an FFT portion of a transform component within that modem FIGS. 6A–B show encoder and decoder portions of an embodiment of the time domain FEC 280 (See FIG. 2) which reduces Peak to Average Ratios (PAR) for the modem. This particular embodiment of the invention by reducing PAR allows the power requirements and/or linearity of the DAC 228 (See FIG. 2) and any line drivers associated with the analog portion 226 of the transmit path to be relaxed thus reducing both the cost and complexity of the modem. The encoder 618 encodes sub-symbols in the time domain output by the IFFT 214 (See FIG. 2). This encoder represents an alternate embodiment of the encoder portion 218 of the time domain FEC shown on the transmit path of the modem embodiment of FIG. 2. The encoder accepts an input of N bits on signal line 216 and outputs N+R bits on the output 220 to the cyclic extension and window overlap component 222. One of the major factors contributing to high PAR in modems supporting multiple sub-channels is the non-uniform distribution of sub-symbols at the output of the IFFT or other frequency-to-time domain transform component. The encoder 518 reduces PAR by encoding sub-symbols in a manner which increases the uniformity of the distribution of the encoded sub-symbols in the output from the encoder. This is accomplished by altering the magnitude of the redundant bit depending on the voltage level 230 at the output of the analog portion 226 of the transmit path of the modem. The encoder adds a redundant bit which matches the most significant bit of the binary data and complements the most significant bit of the binary data depending on the voltage level 230.

The operation of the encoder will be set forth for the case where the IFFT outputs two tones each with a one bit representation as binary "0" or "1". As the number of tones and bits per tone increases the encoder is scaled accordingly. In FIG. 6A the IFFT outputs N bits. In the example shown N=2. The IFFT outputs 2 sub-symbols with one bit each on signal line 216. The encoder outputs N+R bits on signal line 220 where R is the number of redundant bits. In the example shown R=1.

The encoder comprises a threshold detector 624, and logic including 'AND' gates 600,602,606; 'OR' gate 604, exclusive or 'XOR' gate 608 and memory 612. The two bits of the IFFT output 216 are applied to the inputs of 'AND' gate 600, and with one of the bits inverted to the input of 'AND' gate 602. The output of the 'AND' gates is provided to the input of the 'OR' gate 604. The output of the 'OR' gate 604 is provided to one of the two inputs of 'AND' gate 606. The other input of the 'AND' gate 606 is provided by the output of the threshold detector 624. The threshold detector has a threshold input 622 at a fixed threshold voltage and an analog input on signal line 230 from the output of the analog portion 226 of the transmit path of the modem. This output of the threshold detector has a value of binary '0' when a peak which exceeds the threshold voltage is present in the analog output on line 230 and otherwise has a value of binary '1'. The output of 'AND' gate 606 provides one of two inputs to 'XOR' gate 608. The other input 610 to the 'XOR' gate is provided by feedback of the XOR output on line 614 through a memory 612, e.g. a "D" flip-flop, and onto signal line 610. The output of the XOR gate 608 on line 616 provides the redundant bit portion of the encoder output 220. The remaining two bits of the output 220 are provided by feed-through of the two bits on signal line 216 from the IFFT output.

FIG. 6B shows the corresponding decoder 662 which is part of receive path portion of the time domain FEC 280 shown in FIG. 2 for the receiving modem. This decoder represents an alternate embodiment of the decoder portion 262 of the time domain FEC shown in FIG. 2. The decoder accepts an input of N+R bits on signal line 260 from the cyclic extension removal component 258 of the receiving modem and outputs N bits on the output 264 to the FFT 266. The parser 650 parses the redundant bit 652 from each symbol set and provides the original bits on signal line 654 to the output 264. These original bits on line 654 correspond with the output 216 of the IFFT 214 on the transmit path of the transmitting modem as shown in FIG. 6A.

Figure 7:
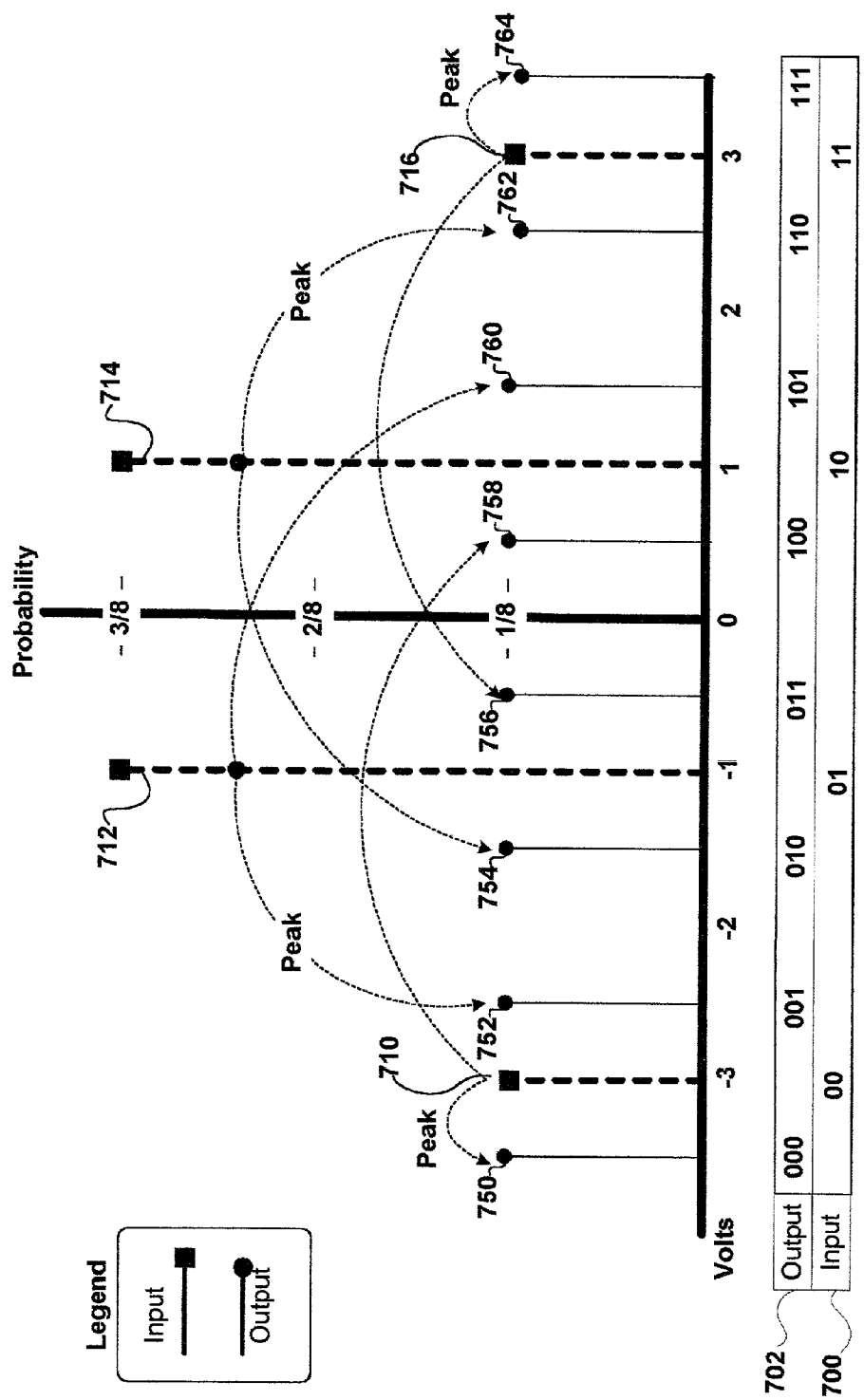
FIG. 7 is a probability diagram showing probability distributions at the input and output of the encoder portion of the FEC component shown in FIG. 6A.

FIG. 7 is a probability diagram showing probability distributions at the input 216 and output 220 of the encoder 618 shown in FIG. 6A. The vertical axis of the distribution ranges from a probability of zero up to a probability of 3/8. The horizontal axis shows the voltages, e.g. ±3.5, present at the transmit path output 230 for the binary output 216 of the IFFT 214 (See FIG. 6A) with and without the PAR reducing encoding as effected by the logic shown in FIG. 6A. The graph shows a probability distribution 710, 712, 714, 716 exhibited by the four possible values for the un-encoded binary inputs 700. This distribution if applied to directly to the DAC 228 (See FIG. 2) would result in a PAR of 3.00 at the output of the transmit path of the modem. The graph also shows the probability distribution 750–764 exhibited by the binary values 702 output by the PAR reducing encoder 618 shown in FIG. 6A. This distribution exhibits a PAR of 2.3 which is significantly less than the PAR of the modem without the PAR reducing encoder.

The encoder increases the number of bits by R=1, thus a 2 bit input becomes a 3 bit output. A 3 bit input a 4 bit output and so forth. When a peak is detected on the output the redundant bit duplicates the value of the most significant bit of the binary input, otherwise the redundant bit corresponds with a flip of the most significant bit of the binary input. Thus on a peak $00_b$, $01_b$, $10_b$ and $11_b$ at the input of the encoder become at the output: $000_b$, $001_b$, $110_b$, $111_b$ respectively. Where there is no peak detected on the output of the transmitter the inputs $00_b$, $01_b$, $10_b$ and $11_b$ at the input of the encoder become at the output: $100_b$, $101_b$, $010_b$, $011_b$ respectively. The encoder adds a redundant bit which matches the most significant bit of the binary data for each sub-channel in the time domain and complements the most significant bit of the binary data depending on the output of the threshold detector 624. The overall effect is to spread inner peak probabilities to the outside of the probability distribution when a peak is detected thus reducing the PAR at the transmitter output. At the decoder, the redundant bit is ignored (See FIG. 6B).

Figure 8A:
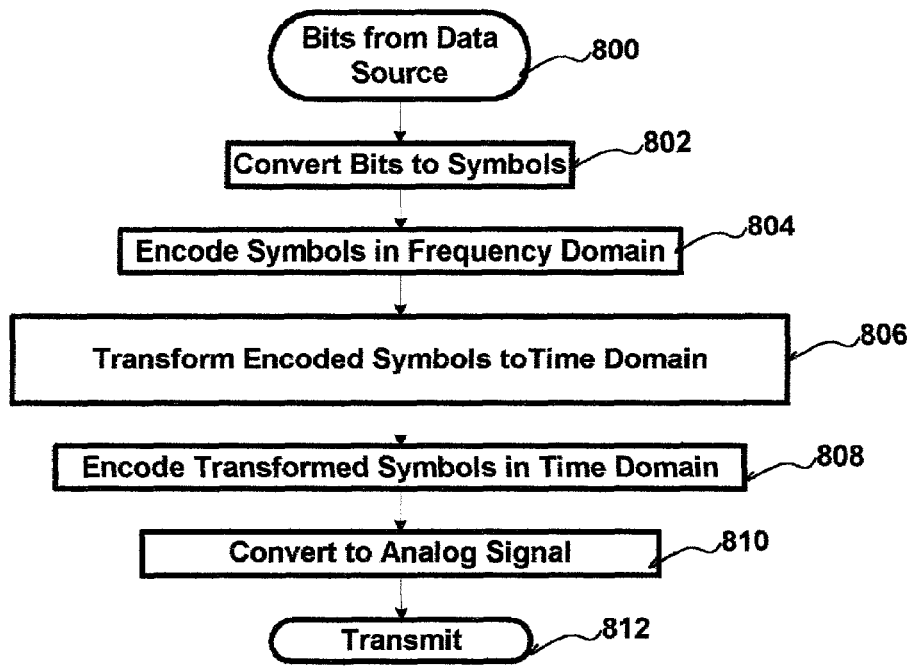
FIGS. 8AB are process flow diagrams of the transmit and receive paths respectively of an embodiment of the modem.

FIGS. 8AB are process flow diagrams of the transmit and receive paths respectively of an embodiment of the modem. In FIG. 8A processing on the transmit path of the modem commences with the next set of bits 800 from the data source. These are converted in process 802 to symbols in the mapper 206 (See FIG. 2). Next the symbols are encoded in process 804. This may occur in the encoder portion 208 of the frequency domain encoder 284 shown in FIG. 2. Then the encoded symbols are transformed in process 806 from the frequency to the time domain. This occurs in the IFFT portion 214 of the transform component 282 shown in FIG. 2. Next the transformed symbols are subject to another encoding in the time domain in process 808. In the embodiment of the modem shown in FIG. 2 this occurs in the encoder portion 218 of the time domain FEC 280 (See FIG. 2). Next in process 810 the symbols encoded in both the frequency and time domains are converted to an analog signal in process 810. In the embodiment of the modem shown in FIG. 2 this occurs in the DAC 228. The analog signal generated in process is then transmitted in process 812 across a communication medium. This process occurs continuously passing thereby a stream of modulated information from the transmitting to the receiving modem.

Figure 8B:
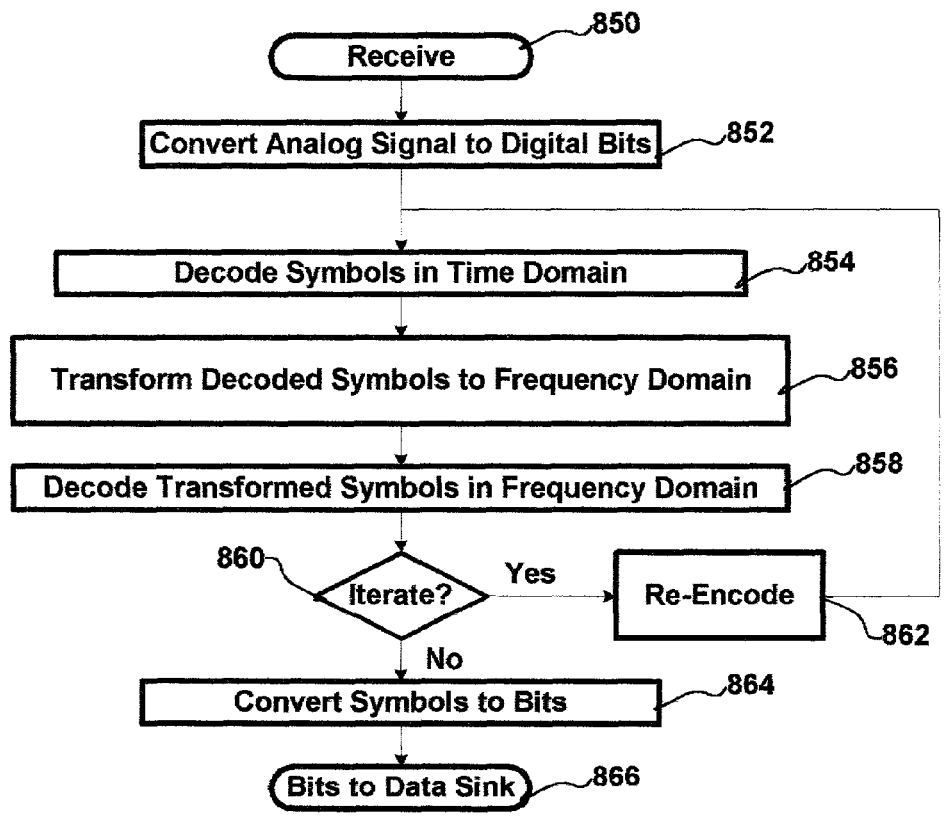

FIG. 8B shows corresponding receive processes for the receive path of a receiving modem. In process 850 an analog communication is received and in process 852 converted to digital bits. In the embodiment of the modem shown in FIG. 2 this occurs in the ADC 254. Then in process 854 the received symbols are decoded in the time domain. In the embodiment of the modem shown in FIG. 2 this occurs in the decoder portion 262 of the time domain FEC 280. Next in process 856 the decoded symbols are transformed from the time to the frequency domain. In the embodiment of the modem shown in FIG. 2 this occurs in the FFT portion 266 of the transform component 282. Then in process 858 the transformed symbols are subject to another decoding in the frequency domain. In the embodiment of the modem shown in FIG. 2 this occurs in the decoder portion 272 of the frequency domain FEC 284. Next control is passed to decision process 860. In decision process 860 a determination is made as to whether iterative decoding is implemented and if it is as to whether further iteration is required. If no iterative decoding is implemented (e.g. See FIG. 2) control passes to process 864. Alternately, if iterative decoding is implemented control and the subject block of information requires further decoding then control passes to process 862. In process 862 the decoded data and any soft information connected therewith is re-encoded, subsequent to which control returns to process 854 for the next iteration of the decoding. Embodiments of modems with iterative decoding are shown in FIGS. 4AB. After each decoding pass through processes 854–858 the decision process 860 determines whether further iterative decoding is required. When no further iteration is required control then passes to process 864. In process 864 the decoded symbols are converted to bits and passes to the data sink in process 866. In the embodiment of the invention shown in FIG. 2 process 864 is implemented in the demapper 274.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A modem with a plurality of components forming a transmit path and a receive path for communicating data across a communication medium using a multiplicity of discrete sub-channels, and the modem comprising:

a first forward error correction (FEC) component with complementary encoder and decoder portions on the transmit path and receive paths respectively, and with the complementary encoder and decoder portions encoding and decoding respectively the multiplicity of discrete sub-channels in a frequency domain;

second FEC component with complementary encoder and decoder portions on the transmit and receive paths respectively, and with the complement encoder and decoder portions encoding and decoding respectively the multiplicity of discrete sub-channels in a time domain; and a Fourier transform component coupled between the first and second FEC, and the transform component for transforming the multiplicity of discrete sub-channels of a communication between the time domain and the frequency domain on the receive path and vice-versa on the transmit path.

2. The modem of claim 1, further comprising;

the first FEC encoder adding a first set of redundant bits into the multiplicity of discrete sub-channels in the frequency domain; and the second FEC encoder adding a second set of redundant bits into the multiplicity of discrete sub-channels in the time domain.

3. The modem of claim 1, further comprising:

a re-encoder switchably coupled between the complementary encoder portion of the second FEC component and the complementary encoder portion of the first FEC component, to form a feedback loop for iterative re-encoding and de-coding of received data, to improve reliability of the decoding of received data.

4. The modem of claim 1, wherein the second FEC further comprises:

the encoder portion on the transmit path including:

a threshold detector to detect levels above a threshold level in signals transmitted by the modem; and logic coupled with the threshold detector and with the Fourier transform component to accept binary data corresponding with the sub-channels transmitted in the time domain from the Fourier transform component and to add a redundant bit to the binary data with the redundant bit matching a most significant bit of the binary data and complementing the most significant bit of the binary data depending on signal levels detected by the threshold detector; and the decoder portion on the receive path including:

a parser to parse the redundant bit from binary data corresponding with each of the sub-channels received in the time domain.

5. The modem of claim 1, comprises at least one of a physical modem and a logical modem.

6. The modem of claim 1, wherein the at least one of the first and second FEC components further comprises:

complementary encoder and decoder portions exhibit a selected one of: a block type, a state machine type and a turbo type.

7. The modem of claim 1, wherein the discrete sub-channels established over the communication medium exhibits at least one of: a discrete multi-tone (DMT) and an orthogonal frequency division multiplexed (OFDM) communication protocol.

8. The modem of claim 1, wherein the communication medium comprises one of a wired medium and a wireless medium.

9. A method for forward error correction (FEC) in a modem with a transmit path and a receive path for communicating data across a communication medium using a multiplicity of discrete sub-channels, and the method comprising:

on the transmit path the steps of:

performing a first FEC encoding on transmitted sub-channels in a frequency domain;

transforming the transmitted sub-channels encoded in the first performing step on the transmit path between the frequency domain and the time domain; and performing a second FEC encoding in the time domain of the transmitted sub-channels transformed in the transforming step on the transmit path.

10. The method of claim 9, further comprising the steps performed on the receive path of;

performing a first FEC decoding of received sub-channels in the time domain;

transforming the multiplicity of discrete sub-channels encoded in the first performing step on the receive path between the time domain and the frequency domain; and performing a second FEC decoding in the frequency domain of the received sub-channels transformed in the transforming act on the receive path.

11. The method of claim 10, further comprising the additional steps performed on the receive path of;

re-encoding in both the time domain and the frequency domain the received sub-channels de-coded on the receive path in the first and second performing steps; and subjecting the received sub-channels re-encoded in the re-encoding step to at least an other round of the first and second performing steps on the receive path to improve reliability of the decoding of the received sub-channels.

12. The method of claim 10, wherein the second performing step on the receive path further comprises parsing on the receive path of the modem a redundant bit from binary data corresponding with each of the received sub-channels in the time domain.

13. The method of claim 9, wherein the second performing step on the transmit path further comprises;

detecting levels above a threshold level value in signals transmitted by the modem on the transmit path; and adding a redundant bit to binary data corresponding with each of the sub-channels in the time domain transformed in the transforming step on the transmit path and with the redundant bit matching a most significant bit of the binary data and complementing the most significant bit of the binary data depending on the signal levels detected in the detecting act step.

14. The method of claim 9, wherein the at least one of the first and second performing steps further comprises at least one of the steps of:

performing an FEC encoding of a block type;

performing an FEC encoding of a state machine type; and performing an FEC encoding of a turbo type.

15. The method of claim 9, wherein the discrete sub-channels established over the communication medium exhibits at least one of: a discrete multi-tone (DMT) and an orthogonal frequency division multiplexed (OFDM) communication protocol.

16. The method of claim 9, wherein the communication medium comprises one of a wired medium and a wireless medium.

17. A means for forward error correction (FEC) in a modem with a transmit path and a receive path for communicating data across a communication medium using a multiplicity of discrete sub-channels, and the means comprising:

on the transmit path;

means for performing a first FEC encoding on transmitted sub-channels in a frequency domain;

means for transforming the sub-channels encoded by the means for performing the first FEC encoding between the frequency domain and a time domain; and means for performing a second FEC encoding in the time domain the transmitted sub-channels transformed by the means for transforming.

18. The means for FEC of claim 17, further comprising on the receive path;

means for performing a first FEC decoding on received sub-channels in the time domain;

means for transforming the sub-channels encoded by the means for performing the first FEC decoding on the receive path between the time domain and the frequency domain; and means for performing a second FEC decoding in the frequency domain on the received sub-channels transformed by the means for transforming on the receive path.

19. The means for FEC of claim 18, further comprising on the receive path;

means for re-encoding in the time domain and the frequency domain the received sub-channels de-coded on the receive path by the means for performing the first and second FEC; and means for subjecting the received sub-channels re-encoded in the means for re-encoding to at least an other round of the decoding performed by the means for performing the first and second FEC on the receive path to improve reliability of the decoding of the received sub-channels.

* * * * *